United States Patent [19]
Ohishi et al.

[11] Patent Number: 4,905,057
[45] Date of Patent: Feb. 27, 1990

[54] SEMICONDUCTOR DEVICES

[75] Inventors: Akio Ohishi; Takao Kuroda; Shinji Tsuji; Motohisa Hirao, all of Tokyo; Hiroyoshi Matsumura, Saitama, all of Japan

[73] Assignee: Hitachi, Ltd., Tokyo, Japan

[21] Appl. No.: 325,123

[22] Filed: Mar. 17, 1989

Related U.S. Application Data

[63] Continuation of Ser. No. 943,148, Dec. 18, 1986, abandoned.

[30] Foreign Application Priority Data

Dec. 18, 1985 [JP] Japan .................................. 60-282853
Feb. 28, 1986 [JP] Japan .................................. 61-41773

[51] Int. Cl.[4] ................................................ H01S 3/18
[52] U.S. Cl. ......................................... 357/17; 357/16; 357/34; 372/44; 372/45; 372/46; 372/48
[58] Field of Search ............... 357/16, 17, 34; 372/44, 372/45, 46, 48

[56] References Cited

U.S. PATENT DOCUMENTS

| | | | |
|---|---|---|---|
| 3,982,261 | 9/1976 | Antypas | 357/30 E |
| 4,366,569 | 12/1982 | Hirao et al. | 357/17 |
| 4,425,650 | 1/1984 | Mito et al. | 357/17 |
| 4,426,700 | 1/1984 | Hirao et al. | 372/46 |
| 4,429,397 | 1/1984 | Sugimoto et al. | 372/46 |
| 4,644,552 | 2/1987 | Ohshima et al. | 372/45 |
| 4,661,960 | 4/1987 | Hirayama et al. | 372/45 |
| 4,661,961 | 4/1987 | Nelson et al. | 357/16 |
| 4,692,206 | 9/1987 | Kaneiwa et al. | 357/16 |
| 4,710,936 | 12/1987 | Shibata et al. | 357/34 |
| 4,751,710 | 6/1988 | Yamaguchi et al. | 372/44 |

OTHER PUBLICATIONS

"Semiconductor Devices . . . ", by S. M. Sze, 1985, p. 268.

Primary Examiner—Andrew J. James
Assistant Examiner—David Soltz
Attorney, Agent, or Firm—Antonelli, Terry & Wands

[57] ABSTRACT

A semiconductor device such as a semiconductor laser device or a transistor which is small in both threshold current and leakage current and exhibits no increase with time in the threshold current and leakage current can be obtained by incorporating pnp or npn junctions in a buried layer which coats an active region containing InGaAsP, forming the mid layer of the junctions with InGaAsP, adjusting the conductivity type of the mid layer with an implanted ion and specifying the energy band width of a semiconductor constituting the mid layer.

26 Claims, 4 Drawing Sheets

SEMICONDUCTOR DEVICES

This application is a continuation of Ser. No. 943,148, filed 12/18/86, now abandoned.

BACKGROUND OF THE INVENTION

This invention relates to a semiconductor device manufacture by taking advantage of junctions in which InGaAsP is used. More particularly, the present invention is concerned with a semiconductor device having such a structure as will provide a high reliability or a small threshold current.

A long wavelength semiconductor laser which oscillates at a band of 1 $\mu$m is conventionally known as a semiconductor device in which InGaAsP is used. In this example, InGaAsP is applied to the buried layer of the semiconductor laser, and it is reported that the user of InGaAsP leads to an easy lateral mode control[see "The Proceeding of Japan Applied Physics Conference, p. 161, No. 1, p-M-2 (Spring, 1984)].

However, no studies have been made on a semiconductor device having a buried layer of a semiconductor structure having junctions in which InGaAsP is used.

SUMMARY OF THE INVENTION

An object of the present invention is to control the current gain and current inhibiting capacity of a semiconductor device by making use of an npn or pnp structure formed by means of junctions in which an InGaAsP layer is used and, at the same time, to ensure its sufficient reliability.

The above-mentioned object can be attained by adopting an InGaAsP layer and a semiconductor structure containing it as a buried layer. By this expedient, an increase in threshold current with time can be suppressed when the semiconductor device is a semiconductor laser while an increase in leakage current with time can be suppressed when the semiconductor device is a transistor.

Further, it has been found that the specification of the structure of a semiconductor element, the composition and thickness of each semiconductor layer, etc. brings about a further excellent effect. For example, when the thickness of the mid layer exceeds a thickness such as the overlapping area of the mid layer and other same conductivity type layer is too wide, the threshold current and leakage current are rapidly increased. The thickness of the active region is generally about 1 $\mu$, and the effect of the present invention cannot be attained when the thickness of the semiconductor layer is less than 0.01 $\mu$m. Further, an improvement in reliability, particularly reliability with respect to the deterioration with time can be attained by properly selecting the composition of the InGaAsP layer in such a manner that the energy band width of the p-type InGaAsP layer forming junctions which constitute the buried layer is in a specific value range. The reason for this will be briefly described below.

When the semiconductor layer forming the junctions of the npn or pnp structure or the p-type or n-type layer corresponding to the mid layer in the multi-layer film of the junctions is formed by means of an InGaAsP layer, the current gain of the junctions having a transistor structure is decreased, leading to a decrease in leakage current. This is attributable to the fact that the life of the minority carrier of the InGaAsP layer is shorter than that of InP. Further, when the composition of the InGaAsP layer is selected so that the energy band width is in the range of 1.2 eV to 1.4 eV (e.g., 1.3 eV to 1.4 eV), not only the energy band width is large but also the lattice constant is similar to InP, leading to an improvement in the quality of the junctions, which in turn enables the rapid deterioration to be prevented.

The decrease in leakage current also lowers the threshold current value of a transistor or a semiconductor laser, leading to an improvement in ease of using it.

According to the present invention, since a semiconductor device which is small in both threshold current and leakage current can be obtained, it is possible to improve the reliability of various electronic devices.

DETAILED DESCRIPTION AND PREFERRED EMBODIMENTS OF THE PRESENT INVENTION

EXAMPLE 1

Figure 1:
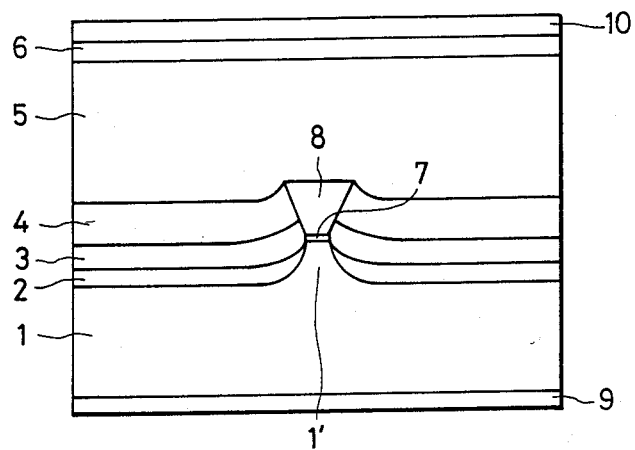
FIG. 1 is a cross-sectional view of one form of a semiconductor device of the present invention prepared in EXAMPLE 1 as will be given later.
Figure 2:
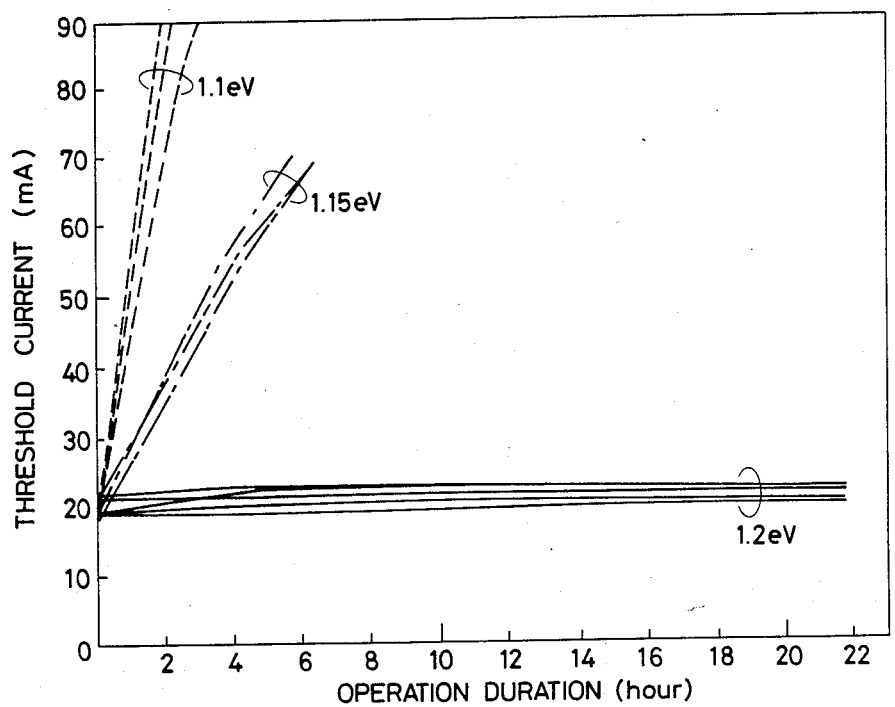
FIG. 2 is a graph illustrating changes in threshold current with time of the semiconductor device of the present invention prepared in EXAMPLE 1 as will be given later.

The present example in which the present invention is applied to the buried layer of a semiconductor laser will be described with reference to FIG. 1. FIG. 1 shows a cross-sectional view of a semiconductor laser formed on an n-type InP substrate. The semiconductor laser as shown in FIG. 1 is prepared as follows. An InGaAsP active layer and a p-type InP layer are formed on an n-type substrate by the liquid phase epitaxy method, and a mesa stripe is then formed while leaving an active region having a width of about 1 $\mu$m behind. Thereafter, a p-type InGaAsP layer 2, a p-type InP layer 3 and an n-type InP layer 4 are grown on the both sides of the mesa by the liquid phase epitaxy, and a p-type InP layer and a p-type InGaAsP layer are then grown over the whole surface thereof. Finally, electrodes 9 and 10 are formed according to a customary method. Thus, there is obtained a semiconductor laser. In the above-prepared device, the thickness of the p-type InGaAsP layer 2 is 0.1 to 0.5 $\mu$m in its flat portions, that of the p-type InP layer 3 is 0.2 to 0.5 $\mu$m, that of the n-type InP layer 4 is 0.3 to 0.6 $\mu$m, that of the p-type InP layer 5 is 1.5 to 3 μm and that of the p-type InGaAsP layer 6 is 0.2 to 0.4 μm. In the device prepared above, an npn structure is constituted of the layers 4, 3 and 2 and the substrate 1, and an InGaAsP layer is present in the p-type layer which is a mid layer. This layer serves as a current inhibiting layer which prevents the current from flowing into the outside of the active layer region. Thus, the current can be inhibited more stably by using an InGaAsP layer as a part of the current inhibiting layer. This is attributable to the fact that when an InGaAsP layer is inserted into a mid layer (p-type layer) which serves as a base in an npn transistor structure, the life of minority carriers of the InGaAsP layer is shorter than that of InP, leading to a small current gain. In the present invention, it is preferred that the energy band width of the InGaAsP layer 2 be 1.2 eV or larger. FIG. 2 shows the results of the tests on the reliability of the semiconductor lasers obtained by varying the composition of the InGaAsP layer 2. In FIG. 2, changes in threshold current at room temperature in a hard screening (operating conditions: 100° C., 200 mA) are plotted against the operating time. As is apparent from FIG. 2, the devices having the InGaAsP layers 2 which respectively have such compositions as exhibit energy band widths of 1.15 eV and 1.1 eV cause a rapid increase in threshold current in a short time. This is attributable to the increase in leakage current due to the deterioration of the buried layer. The extent of the deterioration is larger in the case of a narrower energy band width, i.e. 1.1 eV. On the other hand, in the case of a device having an InGaAsP layer which has such a composition as exhibits an energy band width of 1.2 eV, the increase in threshold current is small, and a stable operation can be attained even after a 20-hr operating period. As is apparent from the foregoing, a buried semiconductor laser which exhibits a decreased leakage current in a transistor operation as well as a stable operation can be realized by adopting an npn structure having an InGaAsP layer, which exhibits an energy band width of 1.2 eV according to the present invention, as a current inhibiting layer.

Figure 6:
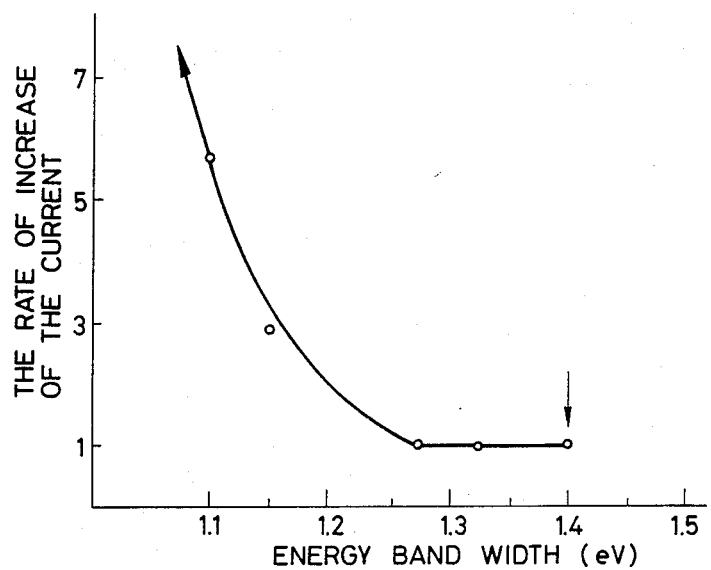

Although the values as shown in FIG. 2 are each an average value of 20 samples, the results on the samples in which the values on the characteristics are within the standard deviation×3 are shown in FIG. 6. As is apparent from FIG. 6, the rate of increase in current was extremely small when the energy band width of the mid layer is 1.27 to 1.4 eV.

In the above-prepared device, an InGaAsP layer 2 is provided on an n-type InP substrate 1. The InGaAsP layer 2 may be provided between the layer 3 and the layer 4 or between the layer 4 and the layer 5 or on a plurality of layers. When the InGaAsP layer 2 is provided between the layer 3 and the layer 4, it may be of either of p-type or n-type, while when the InGaAsP layer 2 is provided between the layer 4 and the layer 5 an n-type is used. When the n-type is used, the InGaAsP layer is present in the n-type layer which is the mid layer of a pnp structure formed from the layers 3, 4 and 5.

Figure 3:
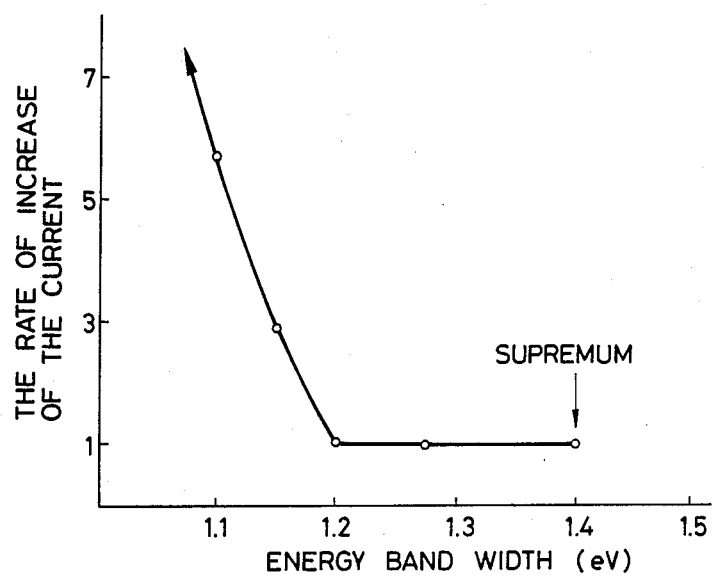
FIGS. 3 and 6 are each a graph illustrating the relationship between the rate of increase in current in terms of threshold current of the semiconductor device of the present invention prepared in EXAMPLE 1 as will be given later and the energy band width of the mid layer.

In the above-prepared device, the energy band width of the buried layer of a quaternary material is varied. Then, the device is operated at 100° C. while flowing a current of 200 mA for 2 hr. The relationship between the rate of increase in current (threshold current after a lapse of time/initial threshold current), which indicates how many times the threshold current is increased after 2 hr relative to the initial value, and the energy band width of the buried layer of the quaternary material is shown in FIG. 3. As is apparent from FIG. 3, the larger the rate of increase in current, the more rapid the deterioration of the semiconductor laser, and no deterioration of the device occurs when the rate of increase in current is 1. As can be seen from FIGS. 3 and 2, when the energy band width is less than 1.2 eV, the deterioration takes place, and the narrower the energy band width, the larger the extent of the deterioration. On the other hand, in the present invention, little or no deterioration occurs when the energy band width is 1.2 eV or more. In this connection, it is noted that an InGaAsP layer which exhibits an energy band width exceeding 1.4 eV could not be formed, and the rate of increase in current with respect to the energy band width to the upper limit, i.e. 1.4 eV, was 1.

EXAMPLE 2

Figure 4:
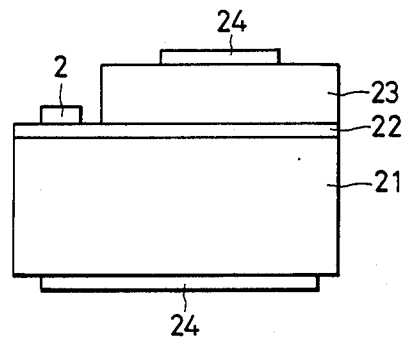
FIG. 4 is a cross-sectional view of another form of a semiconductor device of the present invention prepared in EXAMPLE 2 as will be given later.

FIG. 4 shows one form of an npn transistor prepared in this example according to the present invention. A heterojunction bipolar transistor is formed by growing a p-InGaAsP (Eg≧1.2 eV) layer 22 which serves as a base and an n-InP layer 23 which serves as a collector on an n-type InP substrate 21 and then providing an electrode 24 on each layer. In the transistor thus prepared, the thickness of the p-InGaAsP layer 22 which serves as a base was 0.1 to 0.3 μm, and the composition thereof was selected so that the energy band width was 1.2 eV or more. The transistor prepared in this example can be formed using the buried region as used in EXAMPLE 1 and formed on the same substrate as that used for the semiconductor laser. Further, a stable operation for a long period of time could be realized as in the semiconductor laser prepared in EXAMPLE 1 by selecting the composition so that the energy band width of the base is in the range of 1.2 eV to 1.4 eV.

The present invention can also be applied to a pnp transistor other than the npn transistor as shown in FIG. 4.

Example 3

Figure 5:
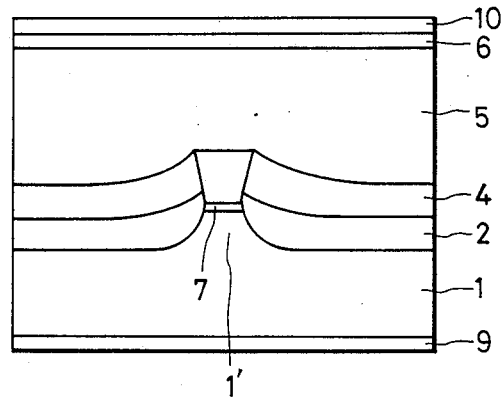
FIG. 5 is a cross-sectional view of still another form of a semiconductor device of the present invention prepared in EXAMPLE 3 as will be given later.

The present example will be described with reference to FIG. 5.

An InGaAsP active layer and an n-type layer are formed on a p-type InP substrate 1 by the liquid phase epitaxy method, and a mesa stripe having a width of 1 μm is then formed thereon.

Subsequently, a p-type InGaAsP layer 2 and an n-type InP layer 4 are grown on the both sides of the mesa by the liquid phase epitaxy, and a p-type InP layer is then grown over the whole surface thereof to obtain a semiconductor laser. In the above-prepared semiconductor laser, the thickness of each layer is the same as that of the semiconductor laser prepared in EXAMPLE 1.

The above-prepared semiconductor laser underwent no deterioration with time as in the semiconductor laser prepared in EXAMPLE 1.

Example 4

Besides the embodiments as described in the above examples there are many embodiments of the present invention. The materials used for forming the substrate and each semiconductor layer of the major ones of such embodiments are shown in Table 1.

TABLE 1

| layer | No. 1 | 2 | 3 | 4 | 5 | 6 | 7 | 8 |
|---|---|---|---|---|---|---|---|---|
| 4th layer | p-InP | n-InP | — | — | — | p-GaAs | p-GaAs | p-GaAs |
| 3rd layer | n-InGaAsP | p-InP | p-InP | n-InP | n-InP | p-InGaAsP | p-InGaP | p-InAsP |
| 2nd layer | p-InGaAsP | n-InGaAsP | n-InGaAsP | P-InP | p-InGaAsP | n-InGaAsP | n-InGaAsP | n-InGaAsP |
| 1st layer | n-InGaAsP | p-InP | p-InGaAsP | n-InGaAsP | n-InP | p-InGaAsP | p-InGaP | p-InGaP |
| substrate | n-InP | n-InP | n-InP | p-InP | p-InP | n-GaAs | n-GaAs | n-GaAs |

| layer | No. 9 | 10 | 11 | 12 | 13 | Ex. 3 | Ex. 2 | Ex. 1 |
|---|---|---|---|---|---|---|---|---|
| 4th layer | n-GaAs | n-GaAs | n-InP | p-GaAs | n-GaAs | — | — | p-InP |
| 3rd layer | n-InAsP | n-InGaP | n-InGaP | n-InGaAsP | n-InGaAsP | p-InP | n-InP | n-InP |
| 2nd layer | p-InGaAsP | p-InGaAsP | p-InGaAsP | p-InGaAsP | p-InGaAsP | n-InP | n-InP | p-InP |
| 1st layer | n-InAsP | n-InGaP | n-InGaP | n-InGaAsP | n-InGaAsP | p-InGaAsP | p-InGaAsP | p-InGaAsP |
| substrate | p-GaAs | p-GaAs | p-GaAs | n-InP | p-GaAs | n-InP | n-InP | n-InP |

In Table 1, the first layer, the second layer, ... show the order of each semiconductor layer which forms the junctions for the buried layer by laminating on a substrate.

For example, in FIG. 1, the first layer is the layer 2, the second layer the layer 3, the third layer the layer 4 and the fourth layer the layer 5.

In the above example, the thickness of the InGaAsP layer 2 was 0.1 to 0.5 μm. Although the same effect can be attained even when the thickness is 1 μm or larger, a thin layer of 1 μm or smaller is advantageous from the standpoint of ease of growth for burying.

Example 5

Figure 7:
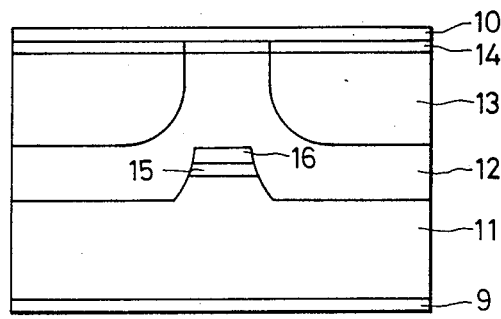
FIG. 7 is a cross-sectional view of a further form of a semiconductor device of the present invention prepared in EXAMPLE 4 as will be given later.

The present example will be described with reference to FIG. 7. In FIG. 7, numeral 11 designates an n-type InP substrate, numeral 12 a p-type InP buried growth layer, numeral 13 an n-type InP layer formed in the p-type InP layer 12 by implanting S (sulfur) or Se (selenium) or Si (silicon) ion and then annealing it, numeral 14 an InGaAsP cap layer, numeral 15 an active layer and numeral 16 a p-type InP cladding layer. The laser structure in this example can be prepared as follows. First, an InGaAsP active layer and a p-type InP cladding layer 16 are grown on an n-type InP substrate, and etching treatment is conducted to remove the portions other than the active layer having a width of 0.5 to 2 μm left behind. The whole surface including the mesa is buried with a p-type InP layer, and an InGaAsP cap layer is grown on the surface thereof. An n-type InP layer is formed by implanting a sulfur, selenium or silicon ion except for the portion which serves as a current path and annealing it to obtain a semiconductor laser. According to this example, a current inhibiting layer can be easily formed as compared with the conventional buried structure in which the both of the p-type layer and n-type layer are grown on the both sides of the mesa by selective growth in conducting the burying growth. Further, the use of the ion implantation technology enabled an n-type layer to be easily formed in a p-type layer as opposed to a conventionally employed diffusion method in which such a formation was conducted with great difficulty.

In this example, it is preferred that the thickness of the n-type layer be at least 1 μm or more. This is to provide a distance between the active layer and the surface layer of 1.5 μm or more and a p layer joint of 0.5 μm or less for sufficiently blocking the current. Providing a distance of 1.5 μm or more between the active layer and the surface layer aims at preventing the lowering in the laser life due to the stress caused by the electrode formed on the surface layer or the influence of the diffusion of metals. Thus, it is necessary to conduct the ion implantation with a high energy, e.g. an energy as high as about 1 MeV in implanting a Si ion.

Although an n-type substrate was used in the present example, the same effect can be attained also by using a p-type. In this case, the conductivity type of each layer should be opposite to that as shown in FIG. 7, and a metal such as zinc, cadmium, beryllium or magnesium is used in implanting an ion into the layer 13 to be converted to a p-type layer.

Further, although in this example an InGaAsP laser formed on an InP substrate was described, the present example may similarly be applied to an A/GaAs laser on a GaAs substrate and an (As) laser on a GaAs substrate.

Example 6

Figure 8:
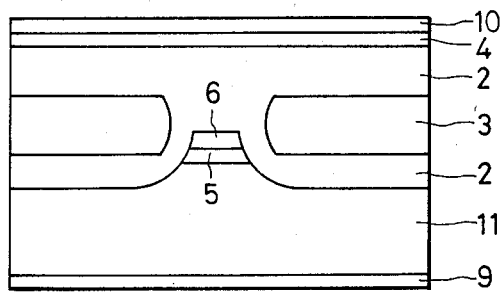
FIG. 8 is a cross-sectional view of a still further form of a semiconductor device of the present invention prepared in EXAMPLE 5 as will be given later.
Figure 9:
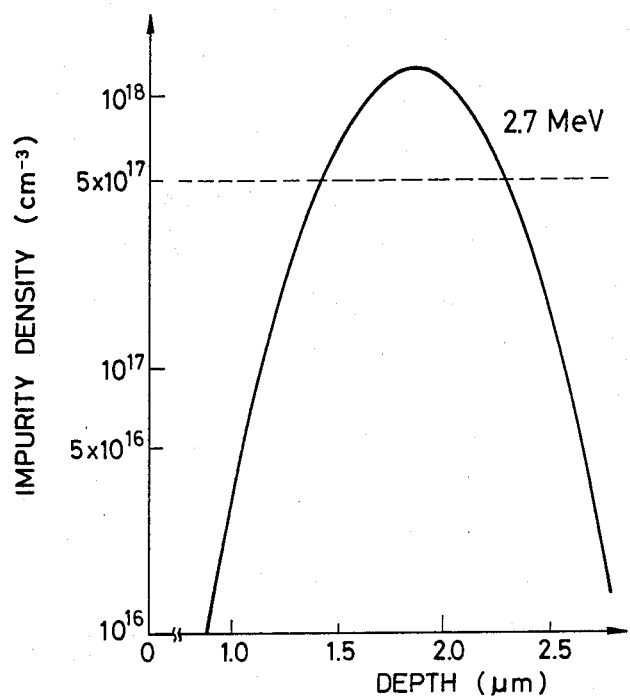
FIG. 9 is a graph illustrating the relationship between the impurity density and the depth.

FIG. 8 shows one form of a laser structure according to the present invention. Each of the layers 11 to 16 was formed in the same manner as in EXAMPLE 4, except that the n-type InP layer 13 was formed in the p-type InP layer in an island-like shape by adjusting the carrier density of the p-type InP layer 12, the dose of the n-type InP layer 13 formed by the ion implantation and the implanting energy. For example, when a silicon ion is implanted into the p-type InP with an energy of 2.7 MeV, an impurity distribution having a peak at a depth of about 2 μm is obtained. An impurity density distribution in the case of a dose of $1 \times 10^{14}$ atom/cm$^2$ is shown in FIG. 9. When the carrier density is $5 \times 10^{17}$ cm$^{-3}$, the region of 1.7 to 2.3 μm in depth is reversed to the n-type layer to form an island-like n-type InP layer 13. At this time, in order to obtain a sufficient current blocking effect, it is preferred that the active layer 15 be out of contact with the layer 13 and that the distance between the active layer 15 and the layer 13 is 1 μm or less. Further, in order that the current inhibiting layer may have a sufficient breakdown voltage, it is preferred that the thickness of the layer 13 be 0.5 μm or more. According to this example, a structure similar to that formed by selective burying growth can be formed without selective burying growth, and a laser capable of operating at a high output and a high temperature can easily be formed.

The present example can be applied to a semiconductor laser having a p-type InP substrate as described in EXAMPLE 1 and general buried semiconductors having substrates of compounds of metals belonging to Groups III to V of the periodic table or mixed crystal substrates including a GaAs substrate.

Example 7

The present example will be described with reference to FIG. 3.

After a mesa active region was formed on an n-type InP substrate 1 in the same manner as in Example 1, a p-type InGaAsP layer 2 was formed by the liquid phase epitaxy. A Si ion was then implanted into the layer at its central part in the same manner as in EXAMPLE 5 to form a layer 3. Subsequently, an InGaAsP cap layer 14 and electrodes 9, 10 were formed according to a customary method to obtain a semiconductor laser device.

Figure 10:
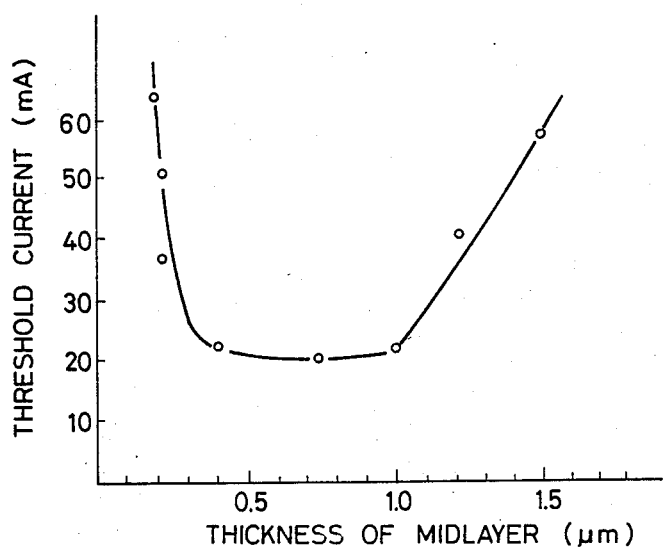

The semiconductor laser device thus obtained had the same characteristics as those prepared in EXAMPLE 1. In the present example, the minimum threshold current was attained when the thickness of the mid layer (InGaAsP layer) 2 was in the range of 0.3 to 1 $\mu$m (see FIG. 10).

Since InGaAsP is shorter in length of the diffusion of the minority carrier than InP, the thickness between the semiconductor layer 3 and the substrate 1 can be reduced by about 40%. Further, since the difference in refractive index between the InGaAsP layer and the active layer is small, the lateral mode is stable even when the width of the active layer is widened.

What is claimed is:

1. A semiconductor device comprising at least one buried hetero-semiconductor laser diode, the at least one buried hetero-semiconductor laser diode including a mesa stripe formed on a substrate, the mesa stripe including a laser active layer and having opposed sides and an upper surface, with semiconductor structure, including a p-n junction, formed on both of the opposed sides of the mesa stripe, the semiconductor structure forming a current blocking layer on each side of the mesa stripe, wherein said semiconductor structure includes at least one InGaAsP layer on each of the opposed sides of the mesa stripe, the energy band width of the InGaAsP layer being at least 1.3 eV and no greater than 1.4 eV.

2. A semiconductor device according to claim 1, wherein the thickness of the InGaAsP layer is at least 0.01 $\mu$m.

3. A semiconductor device according to claim 1, wherein the active layer has at least one InGaAsP sub-layer.

4. A semiconductor device according to claim 1, wherein a further semiconductor layer is formed on the semiconductor structure and on the mesa stripe so as to bury the mesa stripe.

5. A semiconductor device according to claim 1, wherein the substrate is an n-type substrate, the at least one InGaAsP layer being a p-type InGaAsP layer provided on the n-type substrate, adjacent thereto.

6. A semiconductor device according to claim 5, wherein the n-type substrate is an n-type InP substrate.

7. A semiconductor device according to claim 1, wherein the at least one InGaAsP layer is a p-type InGaAsP layer, and wherein the semiconductor structure further includes an n-type layer so as to form said p-n junction.

8. A semiconductor device according to claim 7, wherein the n-type layer is an n-type InP layer.

9. A semiconductor device according to claim 1, wherein the at least one InGaAsP layer is an n-type InGaAsP layer, and wherein the semiconductor structure further includes a p-type layer so as to form said p-n junction.

10. A semiconductor device according to claim 9, wherein said p-type layer is a p-type InP layer.

11. A semiconductor device according to claim 1, wherein the semiconductor structure includes at least first, second and third layers, sequentially stacked one on the other, on the substrate, the substrate being made of a material selected from the group consisting of n-type InP, p-type InP, n-type GaAs and p-type GaAs; the first layer being made of a material selected from the group consisting of n-type InGaAsP, p-type InGaAsP, p-type InP, n-type InP, p-type InGaP, n-type InGaP, and n-type InAsP; the second layer being made of a material selected from the group consisting of n-type InGaAsP, p-type InGaAsP, p-type InP and n-type InP; and the third layer being made of a material selected from the group consisting of n-type InGaAsP, p-type InGaAsP, p-type InP, n-type InP, p-type InGaP, n-type InGaP, p-type InAsP and n-type InAsP, with at least one of the first, second and third layers being of InGaAsP, and with two of the first, second and third layers forming said p-n junction.

12. A semiconductor device according to claim 11, wherein a fourth semiconductor layer is provided on the third semiconductor layer, so as to bury the mesa stripe, the fourth semiconductor layer being made of a material selected from the group consisting of p-type InP, n-type InP, p-type GaAs and n-type GaAs.

13. A semiconductor device according to claim 1, wherein the semiconductor structure includes a second p-n junction.

14. A semiconductor device according to claim 1, further including, on said substrate, at least one hetero-junction bipolar transistor, the base layer of said at least one hetero-junction bipolar transistor being formed of InGaAsP.

15. A semiconductor device according to claim 14, wherein the InGaAsP of the base layer of the at least one hetero-junction bipolar transistor has an energy band width of at least 1.2 eV and not more than 1.4 eV so as to suppress increase in leakage current with time.

16. A semiconductor device according to claim 15, wherein the InGaAsP of said base layer has an energy band width of at least 1.3 eV and not more than 1.4 eV.

17. A semiconductor device according to claim 1, wherein the InGaAsP layer having an energy band width of at least 1.3 eV and no greater than 1.4 eV constitutes a current inhibiting layer of the semiconductor device.

18. A semiconductor device according to claim 17, wherein the energy band width of InGaAsP layer is at least 1.3 eV and no greater than 1.4 eV such that substantially no increase in threshold current occurs with time.

19. A semiconductor device according to claim 1, wherein the energy band width of InGaAsP layer is at least 1.3 eV and no greater than 1.4 eV such that substantially no increase in threshold current occurs with time.

20. A semiconductor device according to claim 14, wherein said base layer is of InGaAsP having such an energy band width that increase in leakage current with time can be suppressed.

21. A semiconductor device comprising a bipolar transistor having emitter and collector semiconductor layers separated by a base layer, with respective electrodes being provided to each of the emitter, base and collector layers, wherein the base layer is formed of InGaAsP, the energy band width of the InGaAsP base layer being at least 1.2 eV and not more than 1.4 eV.

22. A semiconductor device according to claim 21, wherein the energy band width of the InGaAsP base layer is at least 1.3 eV and not more than 1.4 eV.

23. A semiconductor device according to claim 21, the energy band width of the InGaAsP being an energy band width so as to suppress leakage increase in current with time.

24. A semiconductor device comprising at least one buried hetero-semiconductor laser diode, the at least one buried hetero-semiconductor laser diode including a mesa stripe formed on a substrate, the mesa stripe including a laser active layer and having opposed sides and an upper surface, with semiconductor structure, including a p-n junction, formed on both of the opposed sides of the mesa stripe, the semiconductor structure forming a current blocking layer on each side of the mesa stripe, wherein the p-n junction is a junction formed by implanting ions into semiconductor material forming the semiconductor structure so as to provide the p-n junction.

25. A semiconductor device according to claim 24, wherein the semiconductor material is a p-type material, and the ions implanted are selected from the group consisting of S, Se and Si, to convert a portion of the p-type material to n-type material so as to provide the p-n junction.

26. A semiconductor device according to claim 24, wherein the semiconductor material is an n-type material, and the ions implanted are selected from the group consisting of Zn, Cd, Be and Mg, to convert a portion of the n-type material to p-type material so as to provide the p-n junction.

* * * * *